(12) United States Patent
Prior et al.

(10) Patent No.: US 7,288,843 B2
(45) Date of Patent: Oct. 30, 2007

(54) INTEGRATED CIRCUIT CHIP SUPPORT SUBSTRATE FOR PLACING IN A MOLD, AND ASSOCIATED METHOD

(75) Inventors: Christophe Prior, Le Touvet (FR); Laurent Herard, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 445 days.

(21) Appl. No.: 10/470,320

(22) PCT Filed: Jan. 24, 2002

(86) PCT No.: PCT/FR02/00297

§ 371 (c)(1),
(2), (4) Date: Dec. 1, 2003

(87) PCT Pub. No.: WO02/059959

PCT Pub. Date: Aug. 1, 2002

(65) Prior Publication Data

US 2004/0075191 A1 Apr. 22, 2004

(30) Foreign Application Priority Data

Jan. 26, 2001 (FR) .................................. 01 01096

(51) Int. Cl.
*H01L 23/22* (2006.01)

(52) U.S. Cl. ...................... 257/730; 257/667; 257/687; 257/787

(58) Field of Classification Search ................ 257/687, 257/737–738, 666, 780, 787–789, 795
See application file for complete search history.

(56) References Cited

U.S. PATENT DOCUMENTS 5,612,576 A 3/1997 Wilson et al. ............... 257/788

(Continued)

FOREIGN PATENT DOCUMENTS

WO 02/059959 8/2002

OTHER PUBLICATIONS

Patent Abstracts of Japan, Inventor: Yamada Yasuhiro, "Method and Apparatus for Manufacturing Resin Encapsulated Semiconductor Device", Publication No. 11274195, Publication Date: Oct. 8, 1999.

(Continued)

*Primary Examiner*—Cathy F. Lam
(74) *Attorney, Agent, or Firm*—Lisa K. Jorgenson; Allen, Dyer, Dopplet, Milbrath & Gilchrist, P.A.

(57) ABSTRACT

A substrate, in particular, a multilayer substrate, includes a mounting and electrical-connection support, and a face for mounting at least one integrated circuit chip (IC chip). The substrate and the mounted IC chip are placed in an injection mold. The injection mold has two parts that surround the periphery of the substrate. One part of the injection mold defines a cavity for molding an encapsulation material thereby encapsulating the IC chip, and includes a face for bearing on the mounting face. At least one recess is provided in one part of the injection mold. The recess defines, above the mounting face, a slot for providing a vent for venting gases. The mounting face includes a region on which a metal outer layer is placed. The metal outer layer extends along the recess and on the bearing face on both sides of the recess.

8 Claims, 2 Drawing Sheets

U.S. PATENT DOCUMENTS

| | | | |
|---|---|---|---|
| 5,998,243 A | 12/1999 | Odashima et al. | 438/127 |
| 6,081,997 A | 7/2000 | Chia et al. | 29/841 |
| 6,087,202 A * | 7/2000 | Exposito et al. | 438/113 |
| 6,114,192 A | 9/2000 | Tsunoda et al. | 438/126 |
| 6,413,801 B1 * | 7/2002 | Lin | 438/127 |
| 6,632,704 B2 * | 10/2003 | Kumamoto et al. | 438/106 |
| 6,645,792 B2 * | 11/2003 | Oga et al. | 438/123 |
| 6,767,767 B2 * | 7/2004 | Hayashida et al. | 438/124 |
| 6,830,954 B2 * | 12/2004 | Williams | 438/106 |
| 6,838,313 B2 * | 1/2005 | Kumamoto et al. | 438/106 |
| 6,838,319 B1 * | 1/2005 | Williams | 438/126 |
| 6,858,933 B2 * | 2/2005 | Abela et al. | 257/730 |
| 6,863,516 B2 * | 3/2005 | Williams | 425/129.1 |
| 6,867,487 B2 * | 3/2005 | Huang et al. | 257/687 |

OTHER PUBLICATIONS

Patent Abstracts of Japan, Inventor: Sawai Akiyoshi, "Frame for Semiconductor Device and Manufacture Thereof, and Manufacture of Semiconductor Device Using Frame Therefor", Publication No. 11297921, Publication Date: Oct. 29, 1999.

* cited by examiner

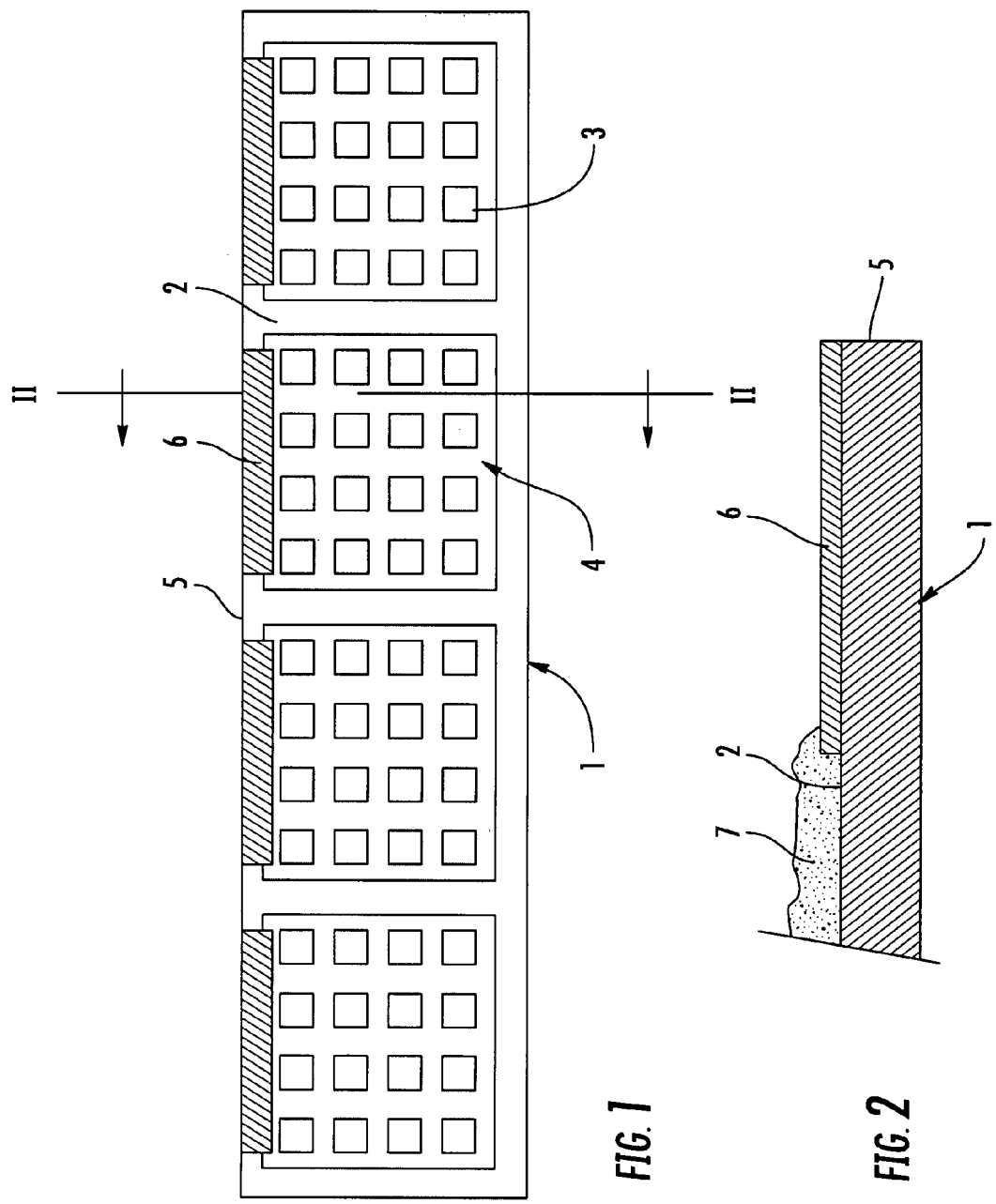

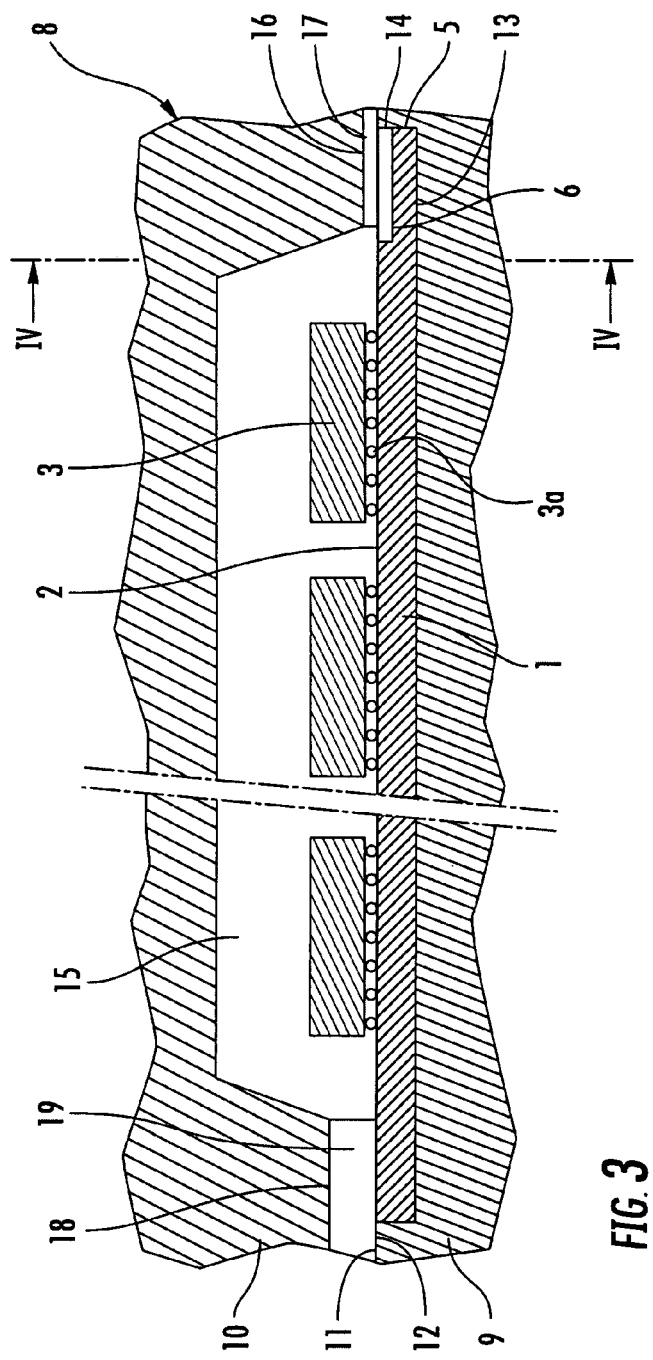
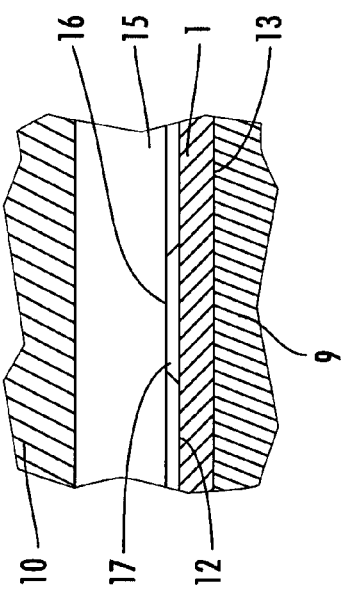
FIG. 3
FIG. 4

INTEGRATED CIRCUIT CHIP SUPPORT SUBSTRATE FOR PLACING IN A MOLD, AND ASSOCIATED METHOD

FIELD OF THE INVENTION

The present invention relates to a substrate, and in particular, to an organic substrate supporting at least one integrated circuit chip (IC chip) and which is suitable for placing in an injection mold to encapsulate the IC chip in encapsulation material.

BACKGROUND OF THE INVENTION

According to a known technique, rows of IC chips are mounted on a common substrate and encapsulated in a block of encapsulation material. The entire assembly is then cut to form individual packages. Each individual package contains an IC chip.

Usually, the injection molds include vents made by slots above the face for mounting the IC chips on the substrates. The vents serve for venting the gases formed during injection of the encapsulation material. The width of the slots is determined by the encapsulation material to be injected, and more particularly, according to the dimensions of the filler particles in the encapsulation material. The tendency is to provide slots with narrower and narrower widths. Thus, the venting of gases during the injection of the encapsulation material is becoming more difficult, especially when the mounting face of the substrates is covered with a varnish layer.

SUMMARY OF THE INVENTION

An object of the present invention is to improve the venting of gases during injection of the encapsulation material while simultaneously reducing the width of the gas venting slots.

According to the invention, the substrate, in particular, a multilayer organic substrate comprising a mounting and electrical-connection support, includes a mounting face for mounting at least one IC chip. The substrate including the IC chip is capable of being placed in the injection mold comprising two parts. The two parts of the injection mold surround the periphery of the substrate. One part of the injection mold may create a cavity for molding the encapsulation material to encapsulate the IC chip and may include a bearing face for bearing on the IC mounting face. At least one recess is preferably formed in the bearing face for defining a slot for venting gases.

According to the invention, the mounting face of the substrate preferably includes a region on which a metal outer layer is provided. The metal outer layer may extend along the recess and onto the bearing face on both sides of the recess. The metal outer layer preferably comprises a strip which at least covers the recess. The metal outer layer also preferably extends without interruption. The metal outer layer may be added onto the region. The metal outer layer may also be integrated into the region.

The substrate mounting face may advantageously be covered with a varnish layer which does not cover the metal outer layer. In addition, the metal outer layer preferably extends outside of the region covered by the IC chip. The substrate may be suitable for mounting at least one row of spaced-apart IC chips. The metal outer layer extends along the at least one row of IC chips.

BRIEF DESCRIPTION OF THE DRAWINGS

The present invention will become more clearly understood by studying a substrate suitable for placing in an injection mold to encapsulate IC chips mounted on the substrate, described by a non-limiting example and illustrated by the drawings in which:

FIG. 1 shows a top view of a substrate including rows of IC chips, in accordance with the present invention;

FIG. 2 shows an enlarged cross-sectional view taken along line II-II as shown in FIG. 1;

FIG. 3 shows a cross-sectional view of an injection mold suitable for accommodating the substrate including the IC chips, in accordance with the present invention; and FIG. 4 shows a cross-sectional view taken along line IV-IV as shown in FIG. 3.

DETAILED DESCRIPTION OF THE PREFERRED EMBODIMENTS

Referring in particular to FIGS. 1 and 2, a substrate 1 shaped as a rectangular plate is shown. In particular, an organic substrate in the form of a multilayer strip that includes a mounting face 2 for mounting a plurality of IC chips 3 is illustrated.

In the example, and in a manner readily known by those skilled in the art, the IC chips 3 are grouped together forming four spaced-apart packets 4 and distributed over the length of the substrate 1. Each packet 4 comprises a matrix of sixteen IC chips spaced apart and distributed to form longitudinal rows and transverse rows. The IC chips 3 are attached to the mounting face 2 via metal balls 3a that furthermore connect the IC chips and an integrated connection network (not shown) on the substrate 1.

The substrate 1 includes, on the mounting face 2 and between a longitudinal edge 5 and a first longitudinal row of IC chips 3 placed a certain distance from the longitudinal edge 5, four regions including metal outer layers 6. The metal outer layers 6 form longitudinal rectangular strips extending, respectively, over the approximate length of the packets 4 and outside of the region covered by the IC chips 3.

In one embodiment, the metal outer layers 6 may be added onto the mounting face 6 before the IC chips 3 are attached. In another embodiment, the metal outer layers 6 may be formed during the process of fabricating the multilayer substrate 1.

As shown in FIG. 2, the mounting face 2 of the substrate 1 is covered with an oxidation-resistant varnish layer 7. The varnish layer 7 does not cover the surface of the metal outer layers 6.

FIGS. 3 and 4 show an injection mold 8 comprising a lower part 9 and an upper part 10 which are suitable for bearing against each other. Each part 9, 10 includes a bearing face 11, 12 to bear against each other. The lower part 9 includes a cavity 13 which is hollowed out in its bearing face 11 and has dimensions to accommodate the substrate 1 with the IC chips 3. The IC chips 3 are placed face-up and the metal outer layers 6 of the substrate 1 run along the longitudinal edge 14 of the cavity 13 and are also positioned face-up.

The upper part 10 of the mold 8 has four flat cavities 15 hollowed out in its bearing face 12. The four flat cavities are formed so that when the upper part 10 of the mold 8 bears on the lower part 9 of the mold, the cavities 15 define injection molding chambers. The injection molding chambers surround, some distance away, the packets 4 of IC chips 3. The bearing face 12 of the upper part 10 of the mold 1 bears on the peripheral region of the mounting face 2 of the substrate 1 and between the packets 4 of IC chips 3.

On longitudinal edge 5 of the substrate 1, corresponding to the position of the metal outer layers 6, the bearing face 12 of the upper part 10 of the mold 8 has a plurality of recesses 16, 18 which define, above the mounting face 2 of the substrate 1, slots 17 forming vents for venting gases. The slots are positioned transverse to the substrate 1, and open into the cavities 15 on one side and open outside the cavity 15 on the opposite side.

More specifically, the recesses 16 define the transverse slots 17. The metal outer layers 6 carried by the substrate 1 are respectively placed so that the metal outer layers 6 extend along the recesses 16 and at least cover the recess 16 so that the metal outer layers 6 extend over the bearing faces 11, 12 on either side of the slots 17. Advantageously, the metal outer layers 6 slightly extend into the cavities 15. Thus, if the varnish layer 7, which covers the mounting face 2 of the substrate 1, projects slightly over the surface of the metal outer layers 6, the varnish layer 7 will not reach the slots 17.

Opposite to the side including the recesses 16, the bearing face 12 of the upper part 10 of the mold 8 includes a plurality of recesses 18. The recesses 18 define, above the mounting face 2 of the substrate 1, injection slots 19. The injection slots 19 open into the side of the cavities 14 on one side, and are connected to a device for injecting the encapsulation material on the other side.

It follows from the above description that, when encapsulation material is injected into the cavities 15 of the mold 1, via the injection slots 19, the gases contained or appearing in the cavities 15 may be vented via the slots 17 defining vents, even if the slots 17 are narrow in width.

The gases may be vented because the gas venting slots 17 are perfectly defined. In particular, the slots 17 are formed by the recesses 16 created in the bearing face 12 of the upper part 10 of the mold 8 and by the metal outer layers 6 located on the mounting face 2 of the substrate 1. The metal outer layers 6 are provided on the mounting face 2 of the substrate 1 independent of the surface finish of the mounting face 2 of the substrate 1 in its other regions and independent of the varnish layer 7. The metal outer layer 6 is a relatively rigid plate that is held in place on either side of the respective recess 16 defining the slot 17.

The present invention is not limited to the example described above. Many alternate embodiments are possible without departing from the scope defined by the appended claims.

The invention claimed is:

1. A substrate assembly to be placed in an injection mold, the substrate assembly comprising:
   a substrate;
   at least one integrated circuit chip on said substrate; and
   at least one metal layer extending along at least one peripheral edge of said substrate;
   the injection mold comprising a first part having a cavity for receiving a lower surface of said substrate, and a second part for defining a cavity over an upper surface of said substrate for molding an encapsulation material for encapsulating said at least one integrated circuit chip, at least one peripheral edge of the second part of the injection mold contacting at least one peripheral edge of the upper surface of said substrate including at least one recess for defining at least one slot for venting gases resulting from the encapsulation of said at least one integrated circuit chip;
   said at least one metal layer contacting the second part of the injection mold and extending along and on both sides of the at least one recess.

2. A substrate assembly according to claim 1, wherein said at least one metal layer is exposed adjacent the at least one slot.

3. A substrate assembly according to claim 1, wherein said at least one integrated circuit chip comprises a plurality of spaced apart integrated circuit chips; and wherein said at least one metal layer extends along a row of said plurality of integrated circuit chips without interruption.

4. A substrate assembly according to claim 1, wherein said at least one metal layer is added to said substrate.

5. A substrate assembly according to claim 1, wherein said at least one metal layer is integrated with said substrate.

6. A substrate assembly according to claim 1, wherein said at least one integrated circuit is mounted to an area of said substrate that is defined as a mounting face; the substrate assembly further comprising a layer of varnish that completely covers the mounting face but does not cover said at least one metal layer.

7. A substrate assembly according to claim 1, wherein said at least one integrated circuit is mounted to an interior area of said substrate that is defined as a mounting face; and wherein said a: least one metal layer overlaps the mounting face and said substrate laterally outside the mounting face.

8. A substrate assembly according to claim 1, wherein said substrate comprises an organic material.

* * * * *